(12) United States Patent
Lai et al.

(10) Patent No.: US 11,562,676 B2
(45) Date of Patent: Jan. 24, 2023

(54) DISPLAY PANEL AND DISPLAY DEVICE

(71) Applicant: Xiamen Tianma Micro-Electronics Co., Ltd., Xiamen (CN)

(72) Inventors: Qingjun Lai, Xiamen (CN); Yihua Zhu, Xiamen (CN); Ping An, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 17/451,126

(22) Filed: Oct. 15, 2021

(65) Prior Publication Data
US 2022/0208051 A1 Jun. 30, 2022

(30) Foreign Application Priority Data
Dec. 31, 2020 (CN) .......................... 202011636551.9

(51) Int. Cl.
*G09G 3/20* (2006.01)
*G11C 19/28* (2006.01)

(52) U.S. Cl.
CPC ............. *G09G 3/20* (2013.01); *G11C 19/287* (2013.01); *G09G 2300/0809* (2013.01); *G09G 2310/0286* (2013.01); *G09G 2310/08* (2013.01)

(58) Field of Classification Search
CPC ............. G09G 3/20; G09G 2300/0809; G09G 2310/0286; G09G 2310/08; G11C 19/287
See application file for complete search history.

(56) References Cited

U.S. PATENT DOCUMENTS

2021/0193044 A1* 6/2021 Meng .................... G09G 3/3233
2021/0193078 A1* 6/2021 Wang ................. H04N 5/22541

FOREIGN PATENT DOCUMENTS

CN          104809978 B      5/2017

* cited by examiner

*Primary Examiner* — Sejoon Ahn
(74) *Attorney, Agent, or Firm* — Anova Law Group, PLLC

(57) ABSTRACT

A display panel and a display device are provided. The display panel includes a driving circuit. The driving circuit includes N-level shift registers cascaded with each other, where N is greater than or equal to two. A shift register includes: a first control unit configured to receive an input signal and control a signal of a first node; a second control unit configured to receive a first voltage signal and control a signal of a second node; a third control unit configured to receive the first voltage signal and generate an output signal, or receive a second voltage signal and generate an output signal in response to a signal of a third node connected to the first node; and a fourth control unit configured to receive the second voltage signal and control the signal of the first node. The first and second voltage signals are high-level and low-level signals, respectively.

18 Claims, 13 Drawing Sheets

DISPLAY PANEL AND DISPLAY DEVICE

CROSS-REFERENCE TO RELATED APPLICATION

This application claims the priority of Chinese patent application No. 202011636551.9, filed on Dec. 31, 2020, the entirety of which is incorporated herein by reference.

FIELD

The present disclosure generally relates to the field of display technology and, more particularly, relates to a display panel and a display device.

BACKGROUND

With the continuous development of display technology, more and more electronic devices with a display function have been widely used in daily life and work, and bring great convenience to daily life and work.

A main component of the electronic device to achieve the display function is a display panel. A scanning signal is outputted from a driving circuit in the display panel, and the scanning signal is transmitted to a pixel array through a gate line, to control the pixel array to display a picture. The driving circuit often includes a plurality of cascaded shift registers. While a previous-level shift register is transmitting an output signal as the scanning signal to the gate line, the output signal as an input signal is transmitted to a following-level shift register, to control the following-level shift register to output a scanning signal.

However, when the load on the output terminal of the shift register is substantially small, the output signal outputted from the shift register tends to be unstable, which will not only affect the stability of the output signal of a following-level cascaded shift register, but also affect the display effect of the entire pixel array. The disclosed display panel and display device are directed to solve one or more problems set forth above and other problems.

SUMMARY

One aspect of the present disclosure provides a display panel. The display panel includes a driving circuit. The driving circuit includes N-level shift registers cascaded with each other, where N is greater than or equal to two. A shift register of the N-level shift registers includes a first control unit, a second control unit, a third control unit, and a fourth control unit. The first control unit is configured to receive an input signal and control a signal of a first node in response to a first clock signal. The second control unit is configured to receive a first voltage signal and control a signal of a second node in response to the input signal and the first clock signal. The third control unit is configured to receive the first voltage signal and generate an output signal in response to the signal of the second node, or receive a second voltage signal and generate an output signal in response to a signal of a third node. The third node is connected to the first node, the first voltage signal is a high-level signal, and the second voltage signal is a low-level signal. The fourth control unit is configured to receive the second voltage signal and control the signal of the first node in response to the input signal and the first clock signal.

Another aspect of the present disclosure provides a display device. The display device includes a display panel. The display panel includes a driving circuit. The driving circuit includes N-level shift registers cascaded with each other, where N is greater than or equal to two. A shift register of the N-level shift registers includes a first control unit, a second control unit, a third control unit, and a fourth control unit. The first control unit is configured to receive an input signal and control a signal of a first node in response to a first clock signal. The second control unit is configured to receive a first voltage signal and control a signal of a second node in response to the input signal and the first clock signal. The third control unit is configured to receive the first voltage signal and generate an output signal in response to the signal of the second node, or receive a second voltage signal and generate an output signal in response to a signal of a third node. The third node is connected to the first node, the first voltage signal is a high-level signal, and the second voltage signal is a low-level signal. The fourth control unit is configured to receive the second voltage signal and control the signal of the first node in response to the input signal and the first clock signal.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
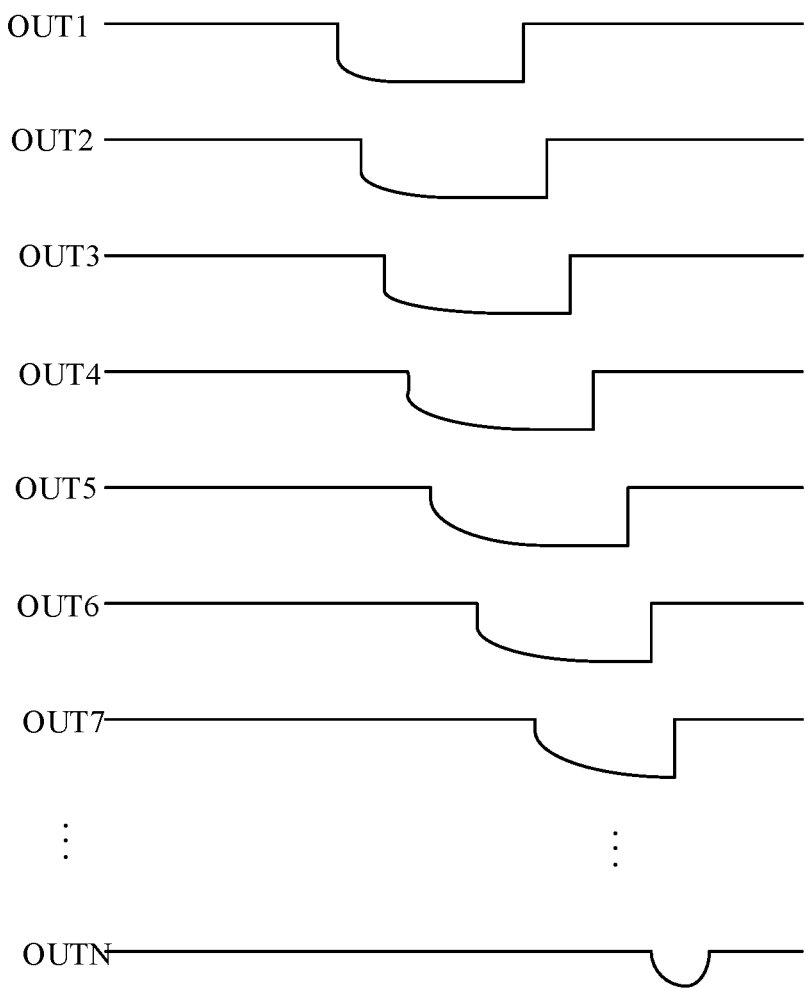
FIG. 1 illustrates a waveform diagram of output signals outputted from output terminals OUT1-OUTN of N shift registers.

When the load on the output terminal of the shift register is substantially small, the output signal outputted from the shift register tends to be unstable. FIG. 1 illustrates a waveform diagram of output signals outputted from output terminals OUT1-OUTN of N shift registers. Referring to FIG. 1, when the load on the output terminal of the shift register is substantially small, the output signal outputted from the output terminal OUT of a first-level shift register tends to have an issue of waveform instability, and such instability will gradually increase as the signal transmits, leading to a risk of easily losing the output signal of the shift register during the transmission.

Figure 2:
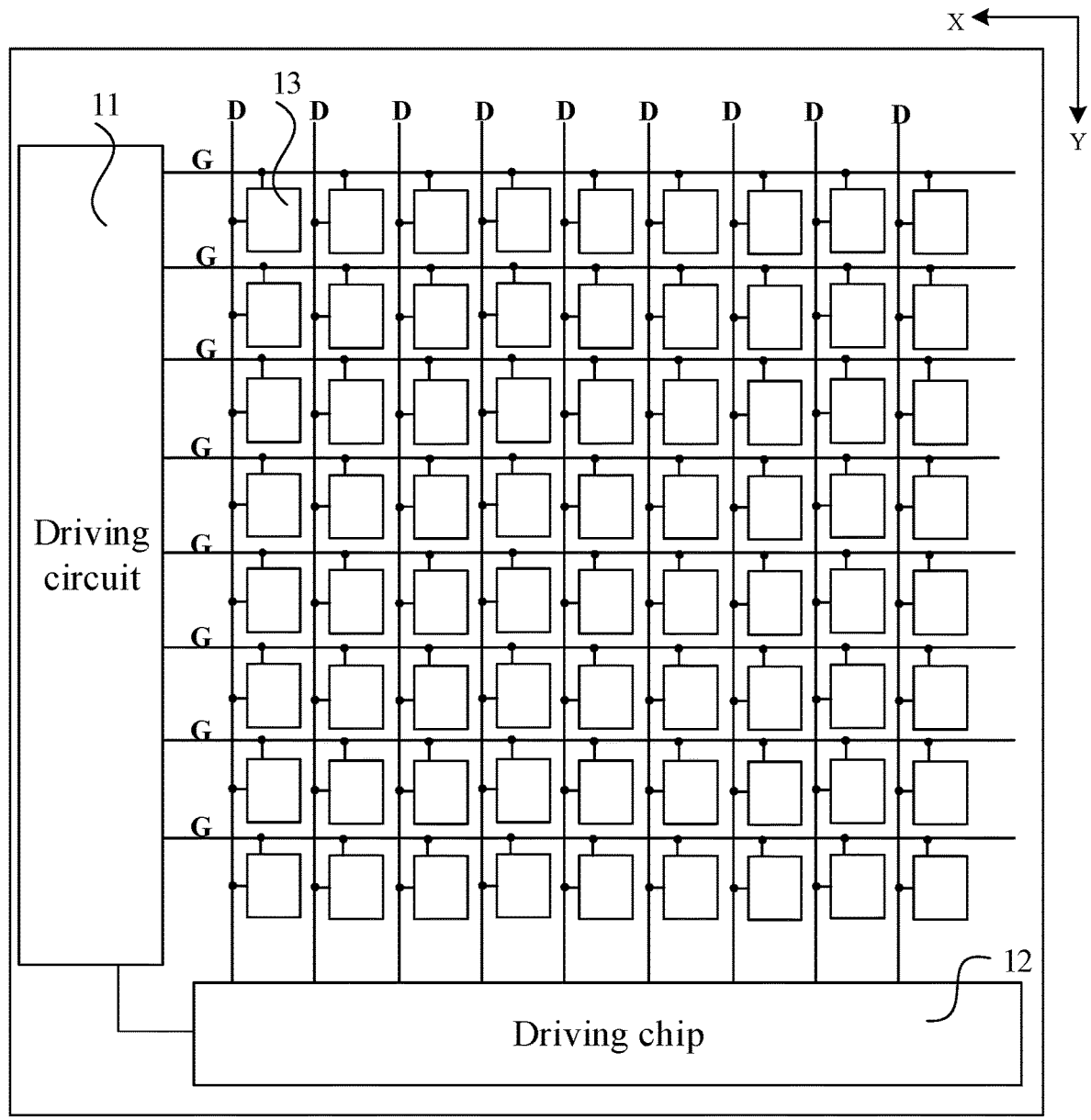
FIG. 2 illustrates a schematic top-view of an exemplary display panel consistent with disclosed embodiments of the present disclosure.

The present disclosure provides a display panel and a display device, to overcome the problems set forth above. FIG. 2 illustrates a schematic top-view of a display panel consistent with disclosed embodiments of the present disclosure. Referring to FIG. 2, the display panel may include a driving circuit 11, a plurality of gate lines G, a plurality of data lines D, a driving chip 12, and a plurality of pixels 13, etc.

The plurality of pixels 13 may be arranged in an array. A row of pixels 13 may be connected to a gate line G, and a column of pixels 13 may be connected to a data line D. The driving circuit 11 may be connected to the plurality of gate lines G, to sequentially input scanning signals to a plurality of rows of the pixels 13 through the plurality of gate lines G. The driving chip 12 may be connected to the plurality of data lines D, to input a data signal to a pixel 13 through a data line D. A switch in the pixel 13 may be turned on after receiving the scanning signal, such that the data signal in the data line D may be transmitted to an electrode in the pixel 13 to charge the electrode, to achieve the display of the picture.

It should be noted that FIG. 2 merely illustrates the structure of one display panel, which may not be limited by the present disclosure. In certain embodiments, the driving circuit 11 may not only be disposed on one side of the display panel, but also be disposed on both sides of the display panel. For example, the driving circuit may be disposed on left and right sides of the display panel, which may not be repeated herein.

Figure 3:
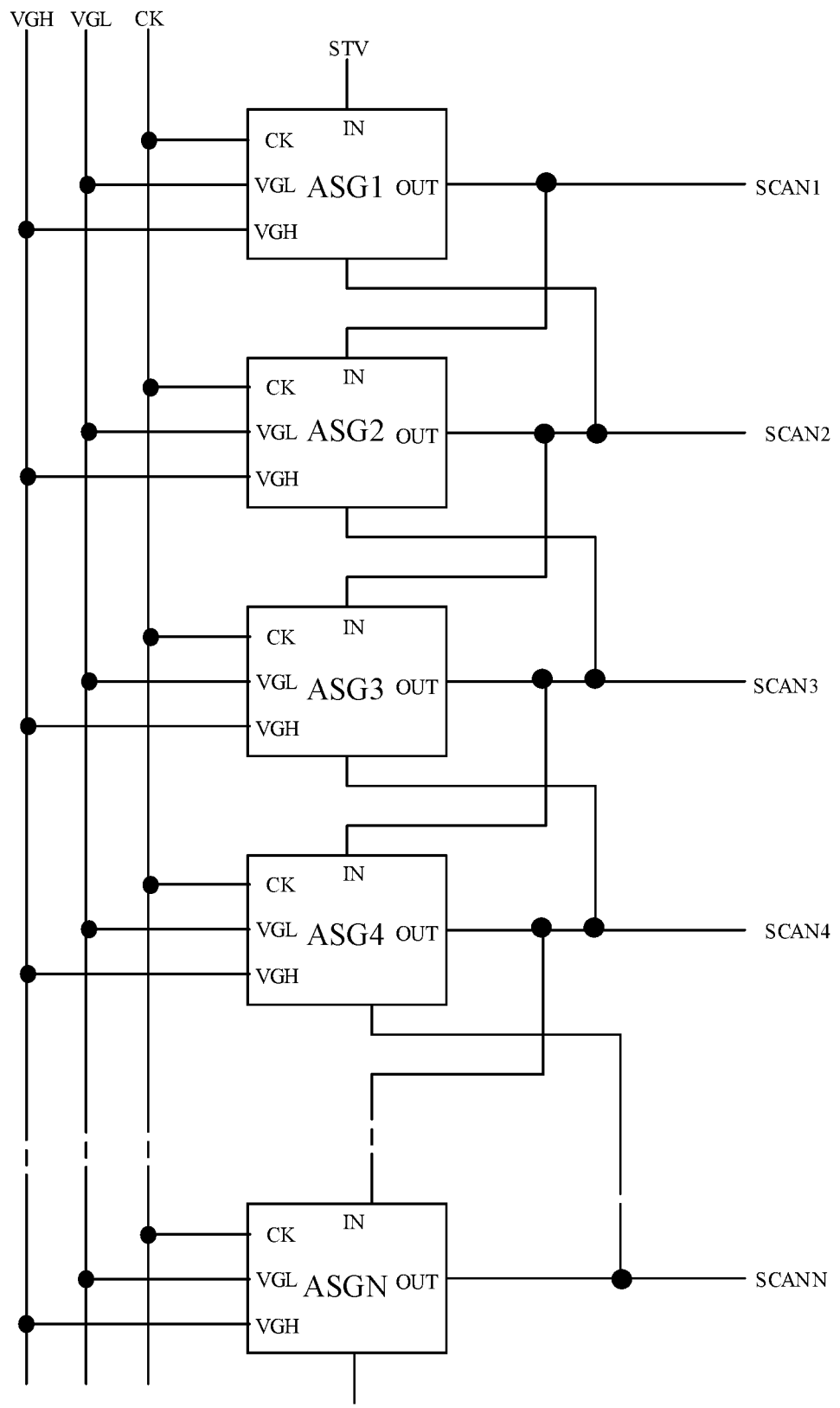
FIG. 3 illustrates a schematic diagram of a driving circuit of an exemplary display panel consistent with disclosed embodiments of the present disclosure.

FIG. 3 illustrates a schematic diagram of a driving circuit of the display panel consistent with disclosed embodiments of the present disclosure. Referring to FIG. 3, the driving circuit may include N-level shift registers cascaded with each other. In other words, the driving circuit may include N cascaded shift registers ASG1-ASGN, where N≥2. An output terminal OUT of a previous-level shift register may be connected to an input terminal IN of a following-level shift register. For example, the output terminal OUT of the shift register ASG1 may be connected to the input terminal IN of the following-level shift register ASG2. The output terminal OUT of the shift register ASG2 may be connected to the input terminal IN of the following-level shift register ASG3, and so on. The output signal, i.e., the scanning signal, outputted from the output terminal OUT of the previous-level shift register may be used as the input signal, and the input signal may be inputted to the input terminal IN of the following-level shift register.

Figure 4:
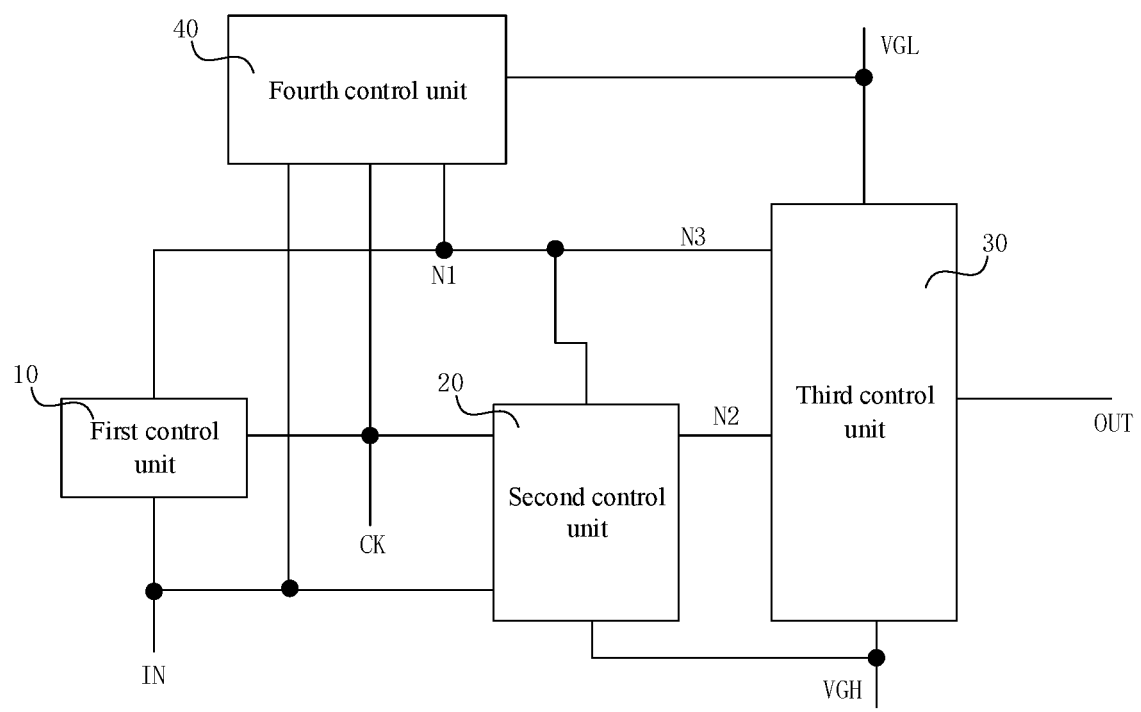
FIG. 4 illustrates a schematic diagram of a shift register of an exemplary display panel consistent with disclosed embodiments of the present disclosure.

FIG. 4 illustrates a schematic diagram of a shift register of the display panel consistent with disclosed embodiments of the present disclosure. Referring to FIG. 4, the shift register may include a first control unit 10, a second control unit 20, a third control unit 30, and a fourth control unit 40.

The first control unit 10 may be configured to receive the input signal IN, and control a signal of a first node N1 in response to a first clock signal CK. The second control unit 20 may be configured to receive a first voltage signal VGH, and control a signal of a second node N2 in response to the input signal IN and the first clock signal CK. The third control unit 30 may be configured to receive the first voltage signal, and generate an output signal OUT in response to the signal of the second node N2, or to receive the second voltage signal VGL and generate an output signal OUT in response to a signal of a third node N3. The third node N3 may be connected to the first node N1, the first voltage signal VGH may be a high-level signal, and the second voltage signal VGL may be a low-level signal. The fourth control unit 40 may be configured to receive the second voltage signal VGL, and control the signal of the first node N1 in response to the input signal IN and the first clock signal CK.

In other words, in the disclosed embodiments of the present disclosure, not only the first control unit 10 may receive the input signal IN and may control the signal of the first node N1 in response to the first clock signal CK, but also the fourth control unit 40 may receive the second voltage signal VGL and may control the signal of the first node N1 in response to the input signal IN and the first clock signal CK, thereby ensuring the stability of the signal of the first node N1. Because the third node N3 is connected to the first node N1, the first control unit 10 and the fourth control unit 40 may ensure the stability of the signal of the third node N3. In addition, the second control unit 20 may receive the first voltage signal VGH and may control the signal of the second node N2 in response to the input signal IN and the first clock signal CK, thereby ensuring the stability of the signal of the second node N2.

The third control unit 30 may receive the first voltage signal VGH and may generate the output signal OUT in response to the signal of the second node N2. Alternatively, the third control unit 30 may receive the second voltage signal VGL and may generate the output signal OUT in response to the signal of the third node N3. Therefore, on the basis of ensuring the stability of the signals of the second node N2 and the third node N3, the stability of the output signal OUT may be ensured, which may in turn ensure the stability of the output signal of the following-level cascaded shift register and the display effect of the display panel.

Figure 5:
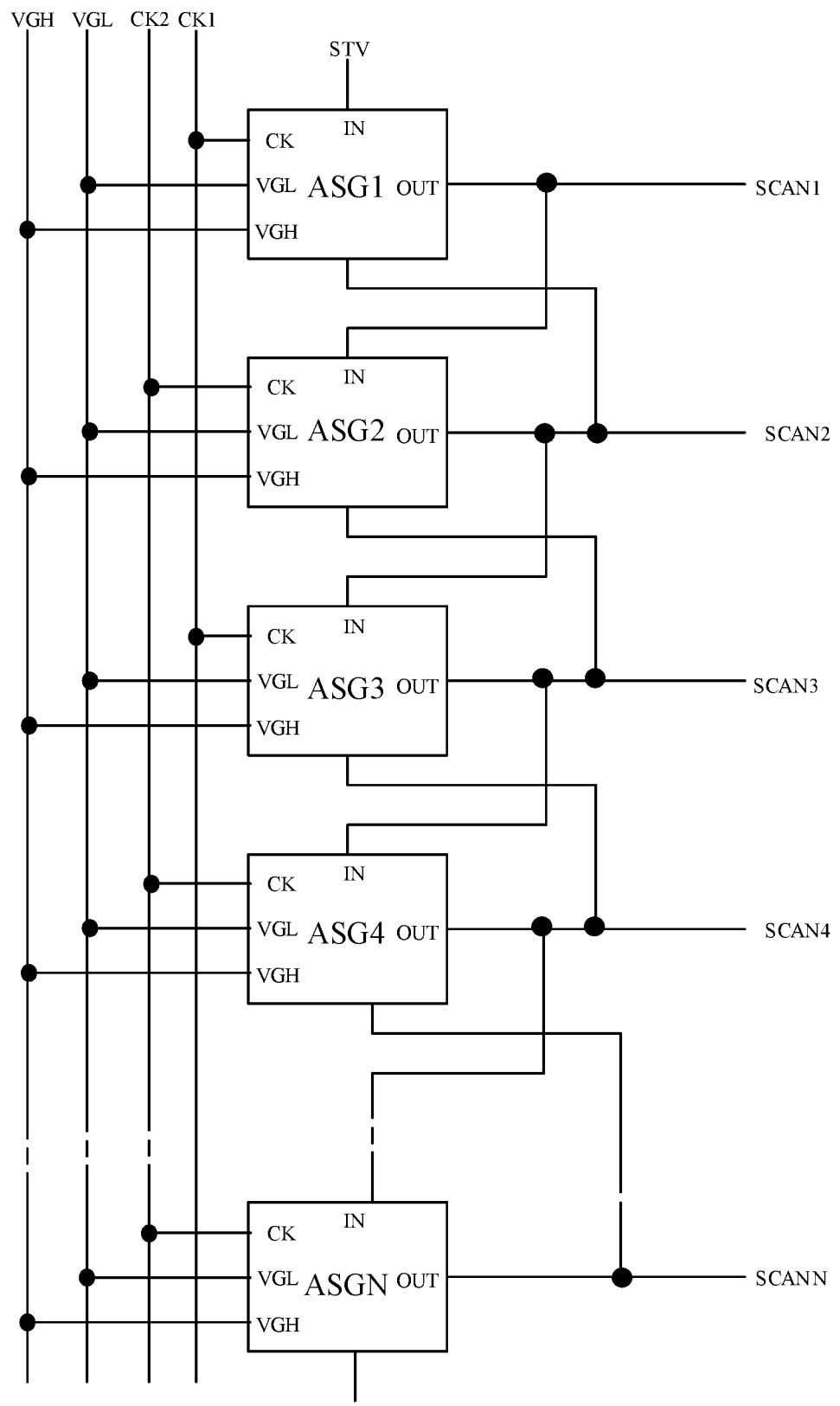
FIG. 5 illustrates a schematic diagram of an internal structure of a driving circuit of an exemplary display panel consistent with disclosed embodiments of the present disclosure.

It should be noted that, for illustrative purposes, FIG. 3 merely illustrates a cascade connection method of N shift registers as an example, which may not be limited by the present disclosure. FIG. 5 illustrates a schematic diagram of an internal structure of a driving circuit of the display panel consistent with disclosed embodiments of the present disclosure. In certain embodiments, referring to FIG. 5, the shift register may include a first shift register and a second shift register. The first clock signal may include a first sub-clock signal and a second sub-clock signal.

The first sub-clock signal may be provided by a first clock signal line CK1, and the second sub-clock signal may be provided by a second clock signal line CK2. In other words, a clock signal input terminal CK of a first shift register may be connected to the first clock signal line CK1, to receive the first sub-clock signal provided by the first clock signal line CK1. Further, the first shift register may control the potentials of the first node N1 and the second node N2 in response to the first sub-clock signal. A clock signal input terminal CK of the second shift register may be connected to the second clock signal line CK2, to receive the second sub-clock signal provided by the second clock signal line CK2. The second shift register may control the potentials of the first node N1 and the second node N2 in response to the second sub-clock signal.

Figure 6:
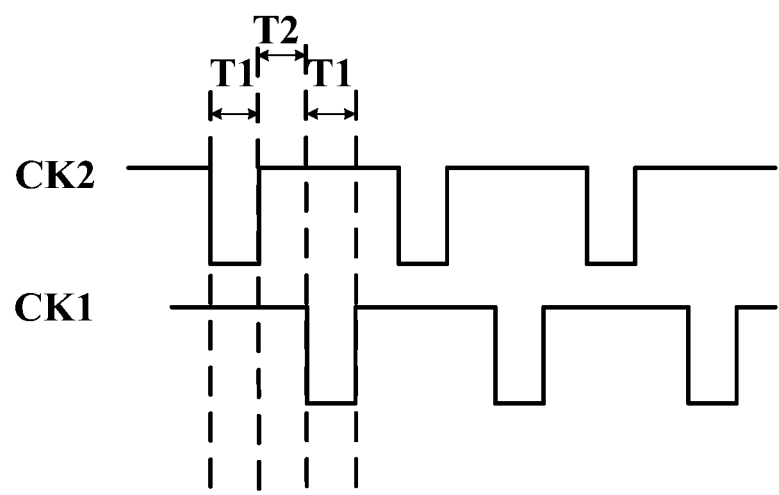
FIG. 6 illustrates a timing diagram of a first sub-clock signal and a second sub-clock signal consistent with disclosed embodiments of the present disclosure.

FIG. 6 illustrates a timing diagram of the first sub-clock signal and the second sub-clock signal consistent with disclosed embodiments of the present disclosure. Referring to FIG. 6, a time length of effective pulses of the first sub-clock signal and the second sub-clock signal may be T1, and a timing of the effective pulse of the first sub-clock signal may lag a timing of the effective pulse of the second sub-clock signal by a time length of T2. In other words, an interval time length between the timing of the effective pulse of the first sub-clock signal and the timing of effective pulse of the second sub-clock signal may be T2, where T2>T1, which may facilitate sequentially controlling the output signals of the first shift register and the second shift register through the first sub-clock signal and the second sub-clock signal.

In certain embodiments, the first shift register may control the output signal of the odd-level shift register, and the second shift register may control the output signal of the even-level shift register. For example, the first shift register may be an odd-level shift register among the first-level shift register ASG1 to the $N^{th}$-level shift register ASGN, and the second shift register may be an even-level shift register among the first-level shift register ASG1 to the $N^{th}$-level shift register ASGN.

In certain embodiments, the first shift register may control the output signal of the even-level shift register, and the second shift register may control the output signal of the odd-level shift register. For example, the first shift register may be an even-level shift register among the first-level shift register ASG1 to the $N^{th}$-level shift register ASGN, and the second shift register may be an odd-level shift register among the first-level shift register ASG1 to the $N^{th}$-level shift register ASGN.

Figure 7:
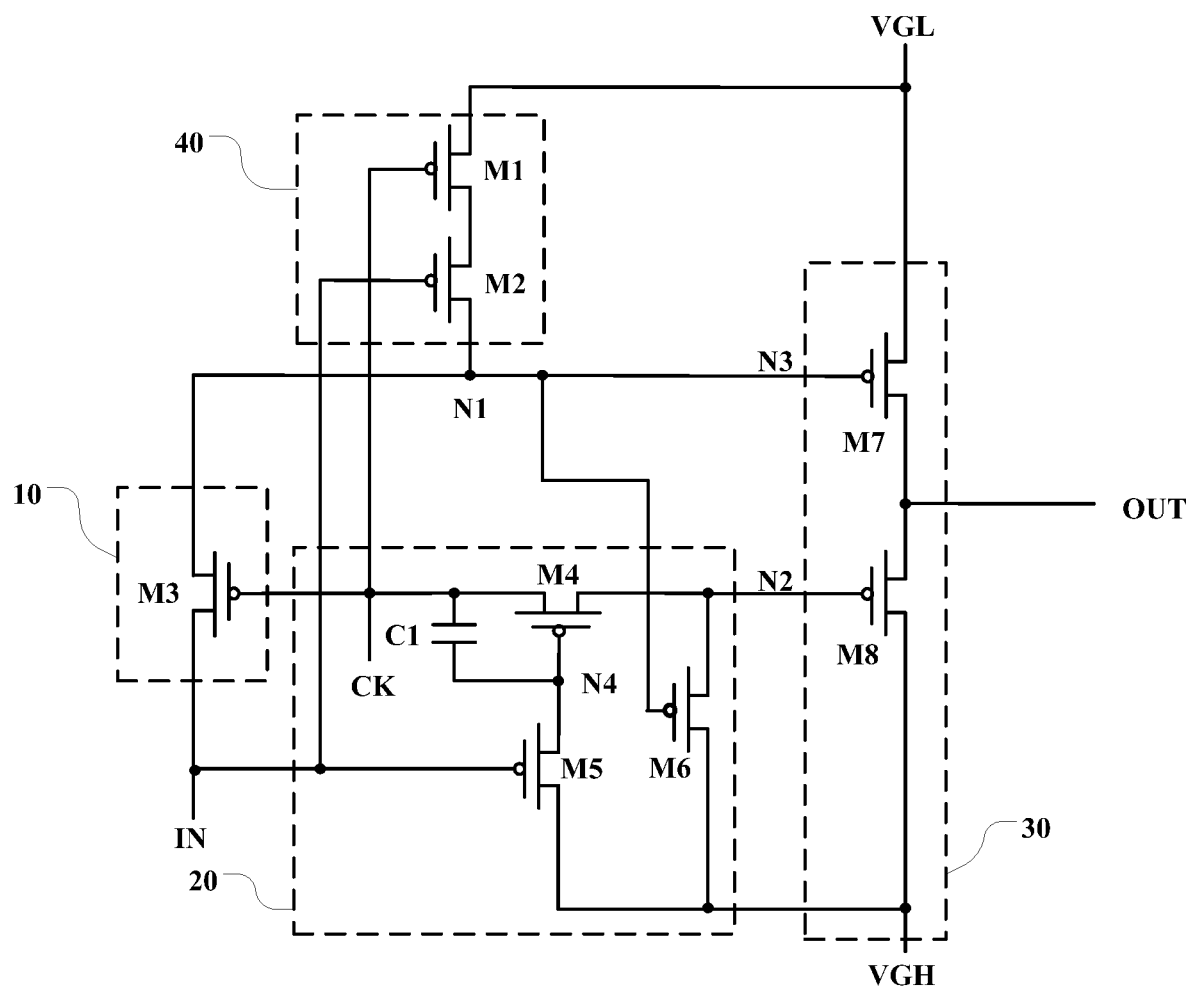
FIG. 7 illustrates a schematic diagram of a shift register of another exemplary display panel consistent with disclosed embodiments of the present disclosure.

FIG. 7 illustrates a schematic diagram of a shift register of a display panel consistent with disclosed embodiments of the present disclosure. On the basis of any of the foregoing embodiments, in certain embodiments, referring to FIG. 7, the first control unit 10 may include a third transistor M3. A source of the third transistor M3 may be connected to the input signal IN, a drain of the third transistor M3 may be connected to the first node N1, and a gate of the third transistor M3 may be connected to the first clock signal CK.

The second control unit 20 may include a fourth transistor M4, a fifth transistor M5, a sixth transistor M6, and a first capacitor C1. A source of the fourth transistor M4 may be connected to the first clock signal CK, a drain of the fourth transistor M4 may be connected to the second node N2, and a gate of the fourth transistor M4 may be connected to the fourth node N4. A source of the fifth transistor M5 may be connected to the first voltage signal VGH, a drain of the fifth transistor M5 may be connected to the fourth node N4, and a gate of the fifth transistor M5 may be connected to the input signal IN. A source of the sixth transistor M6 may be connected to the first voltage signal VGH, a drain of the sixth transistor M6 may be connected to the second node N2, and a gate of the sixth transistor M6 may be connected to the first node N1. A first electrode plate of the first capacitor C1 may be connected to the first clock signal CK, and a second electrode plate of the first capacitor C1 may be connected to the fourth node N4.

The third control unit 30 may include a seventh transistor M7 and an eighth transistor M8. A source of the seventh transistor M7 may be connected to the second voltage signal VGL, a drain of the seventh transistor M7 may be connected to the output signal OUT, and a gate of the seventh transistor M7 may be connected to the third node N3. A source of the eighth transistor M8 may be connected to the first voltage signal VGH, a drain of the eighth transistor M8 may be connected to the output signal OUT, and a gate of the eighth transistor M8 may be connected to the second node N2.

In certain embodiments, referring to FIG. 7, the fourth control unit 40 may include a first transistor M1 and a second transistor M2. The first transistor M1 and the second transistor M2 may control the potential of the first node N1 in response to the first clock signal CK by the first transistor and the input signal IN by the second transistor.

In certain embodiments, referring to FIG. 7, the first transistor M1 and the second transistor M2 may be connected in series. In one embodiment, both the first transistor M1 and the second transistor M2 may be PMOS transistors, which may not be limited by the present disclosure. In another embodiment, both the first transistor M1 and the second transistor M2 may be NMOS transistors. In certain embodiments, one of the first transistor M1 and the second transistor M2 may be a PMOS transistor, and the other one of the first transistor M1 and the second transistor M2 may be an NMOS transistor, which may not be repeated herein.

If both the first transistor M1 and the second transistor M2 are PMOS transistors, when both the first clock signal CK and the input signal IN are low-level signals, in response to the first clock signal CK, i.e., the low-level signal, the first control unit 10 may transmit the input signal IN, i.e., the low-level signal, to the first node N1. At the same time, the first transistor M1 and the second transistor M2 may be turned on, and the second voltage signal VGL, i.e., the low-level signal, may be transmitted to the first node N1.

In other words, when both the first clock signal CK and the input signal IN are low-level signals, the first control unit 10 may pull down the potential of the first node N1 to a low level through the low-level signal, i.e., the input signal IN, and the fourth control unit 40 may also pull down the potential of the first node N1 to a low level through the low-level signal, i.e., the second voltage signal VGL. Therefore, under the dual action of the first control unit 10 and the fourth control unit 40, the potential of the first node N1 may be ensured to be stably maintained at a low level, thereby ensuring the stability of the potential or signal of the first node N1. Because the third node N3 is connected to the first node N1, the stability of the potential or signal of the third node N3 may also be ensured.

Because the first node N1 and the third node N3 control the transistors connected between the second voltage signal VGL terminal and the output terminal OUT, when the output signal OUT is a low-level signal, the stability of the gate potentials of the transistors connected between the second voltage signal VGL terminal and output terminal OUT may require to be substantially high. If the gate potential fluctuates, the output state of the transistor may be affected. Therefore, to obtain a low-level signal with a stable waveform, i.e., to obtain the output signal OUT with a stable waveform, the stability of the potentials of the first node N1 and the third node N3 may need to be further controlled by the fourth control unit 40.

In certain embodiments, referring to FIG. 7, a source of the first transistor M1 may be connected to the second voltage signal VGL, a drain of the first transistor M1 may be connected to a source of the second transistor M2, and a gate of the first transistor M1 may be connected to the first clock signal CK. The source of the second transistor M2 may be connected to the drain of the first transistor M1, a drain of the second transistor M2 may be connected to the first node N1, and a gate of the second transistor M2 may be connected to the input signal IN.

Figure 8:
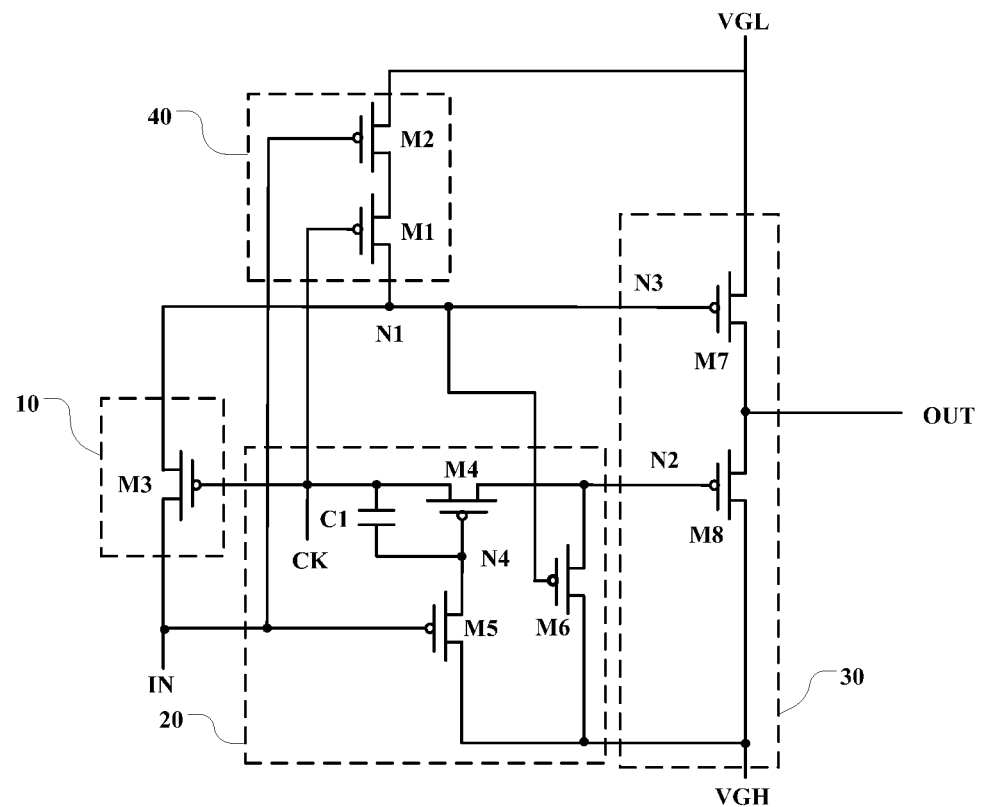
FIG. 8 illustrates a schematic diagram of a shift register of another exemplary display panel consistent with disclosed embodiments of the present disclosure.

FIG. 8 illustrates a schematic diagram of a shift register of another display panel consistent with disclosed embodiments of the present disclosure. In certain embodiments, referring to FIG. 8, the source of the first transistor M1 may be connected to the drain of the second transistor M2, the drain of the first transistor M1 may be connected to the first node N1, and the gate of the first transistor M1 may be connected to the first clock signal CK. The source of the second transistor M2 may be connected to the second voltage signal VGL, the drain of the second transistor M2 may be connected to the source of the first transistor M1, and the gate of the second transistor M2 may be connected to the input signal IN.

Similarly, for illustrative purposes, FIG. 8 merely illustrates that both the first transistor M1 and the second transistor M2 may be PMOS transistors as an example, which may not be limited by the present disclosure. In another embodiment, both the first transistor M1 and the second transistor M2 may be NMOS transistors. In certain embodiments, one of the first transistor M1 and the second transistor M2 may be a PMOS transistor, and the other one of the first transistor M1 and the second transistor M2 may be an NMOS transistor, which may not be repeated herein.

In the structure shown in FIG. 8, when both the first clock signal CK and the input signal IN are low-level signals, in response to the first clock signal CK, i.e., the low-level signal, the first control unit 10 may transmit the input signal IN, i.e., the low-level signal, to the first node N1. At the same time, both the first transistor M1 and the second transistor M2 may be turned on, and the second voltage signal VGL, i.e., the low-level signal, may be transmitted to the first node N1. Therefore, under the dual action of the first control unit 10 and the fourth control unit 40, the potentials of the first node N1 and the third node N3 may be pulled down to a low level, thereby ensuring the stability of the potentials or signals of the first node N1 and the third node N3.

In certain embodiments, the fourth control unit 40 may control the signal of the first node N1 through a circuit with any other structure. For example, the fourth control unit 40 may include three or more transistors, and may control the signal of the first node N1 through the three or more transistors, which may not be repeated herein.

It should be noted that the seventh transistor M7 and the eighth transistor M8 may be output transistors of the shift register. In other words, the seventh transistor M7 and the eighth transistor M8 may be connected to the output terminal OUT. Therefore, the seventh transistor M7 and the eighth transistor M8 may need a substantially large width to length ratio of the channel region to ensure the output effect.

Based on this, in certain embodiments, a width to length ratio of the channel region of the first transistor M1 may be less than the width to length ratio of the channel region of the seventh transistor M7. Alternatively, the width to length ratio of the channel region of the first transistor M1 may be less than the width to length ratio of the channel region of the eighth transistor M8. Alternatively, a width to length ratio of the channel region of the second transistor M2 may be less than the width to length ratio of the channel region of the seventh transistor M7. Alternatively, the width to length ratio of the channel region of the second transistor M2 may be less than the width to length ratio of the channel region of the eighth transistor M8. Therefore, the output effect of the shift register, e.g., the stability of the output signal OUT, may be ensured.

Figure 9:
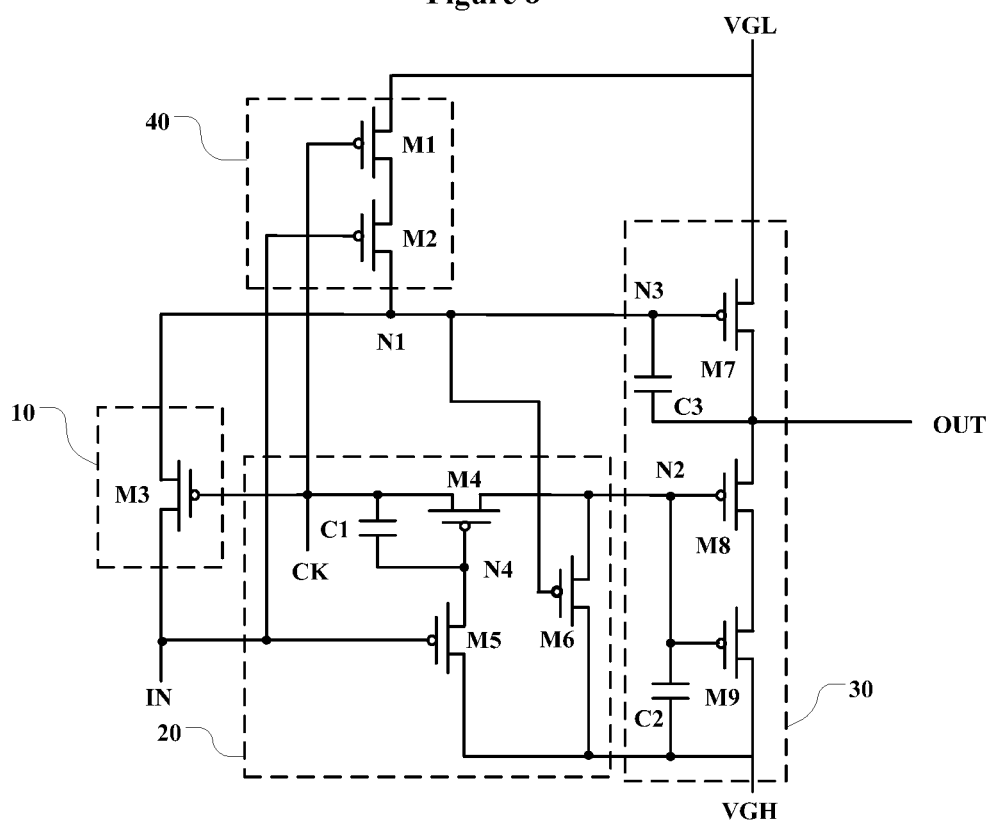
FIG. 9 illustrates a schematic diagram of a shift register of another exemplary display panel consistent with disclosed embodiments of the present disclosure.
Figure 10:
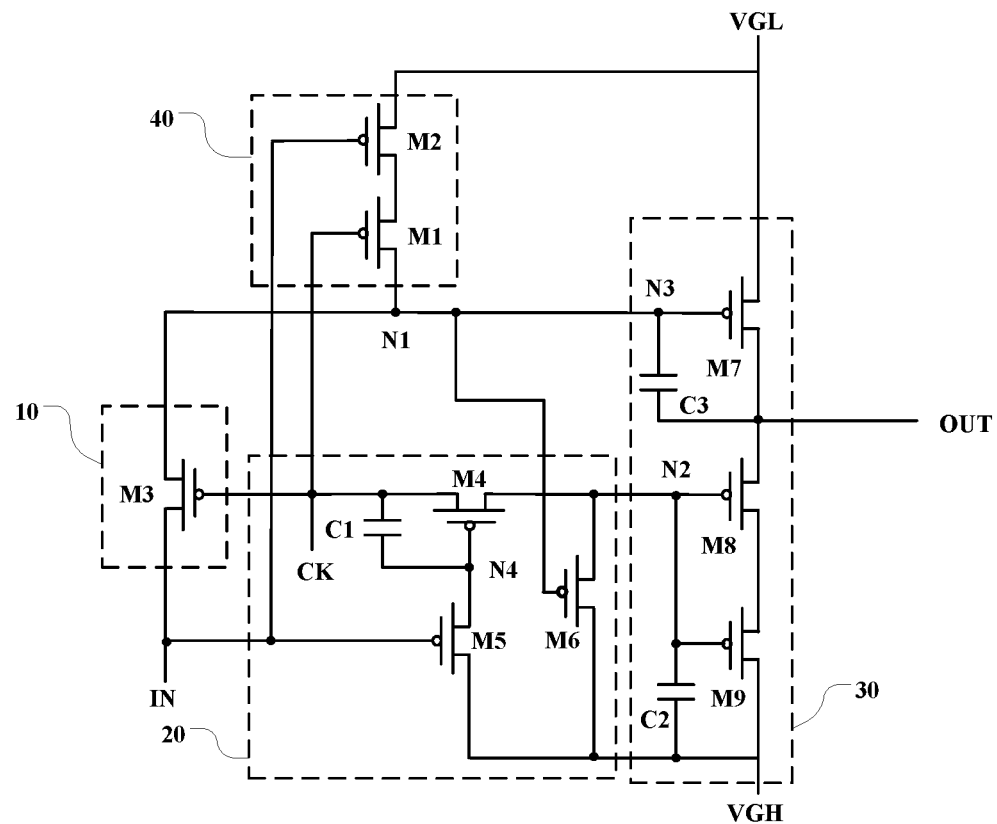
FIG. 10 illustrates a schematic diagram of a shift register of another exemplary display panel consistent with disclosed embodiments of the present disclosure.

FIG. 9 illustrates a schematic diagram of a shift register of another display panel consistent with disclosed embodiments of the present disclosure; and FIG. 10 illustrates a schematic diagram of a shift register of another display panel consistent with disclosed embodiments of the present disclosure. On the basis of the above-disclosed embodiments, in certain embodiments, to further improve the stability of the circuit of the shift register, referring to FIG. 9 and FIG. 10, the third control unit 30 may further include a ninth transistor M9, a second capacitor C2, and a third capacitor C3. A source of the ninth transistor M9 may be connected to the first voltage signal VGH, a drain of the ninth transistor M9 may be connected to the source of the eighth transistor M8, and a gate of the ninth transistor M9 may be connected to the second node N2. A first electrode plate of the second capacitor C2 may be connected to the first voltage signal VGH, and a second electrode plate of the second capacitor C2 may be connected to the second node N2. A first electrode plate of the third capacitor C3 may be connected to the third node N3, and a second electrode plate of the third capacitor C3 may be connected to the output signal OUT.

Figure 11:
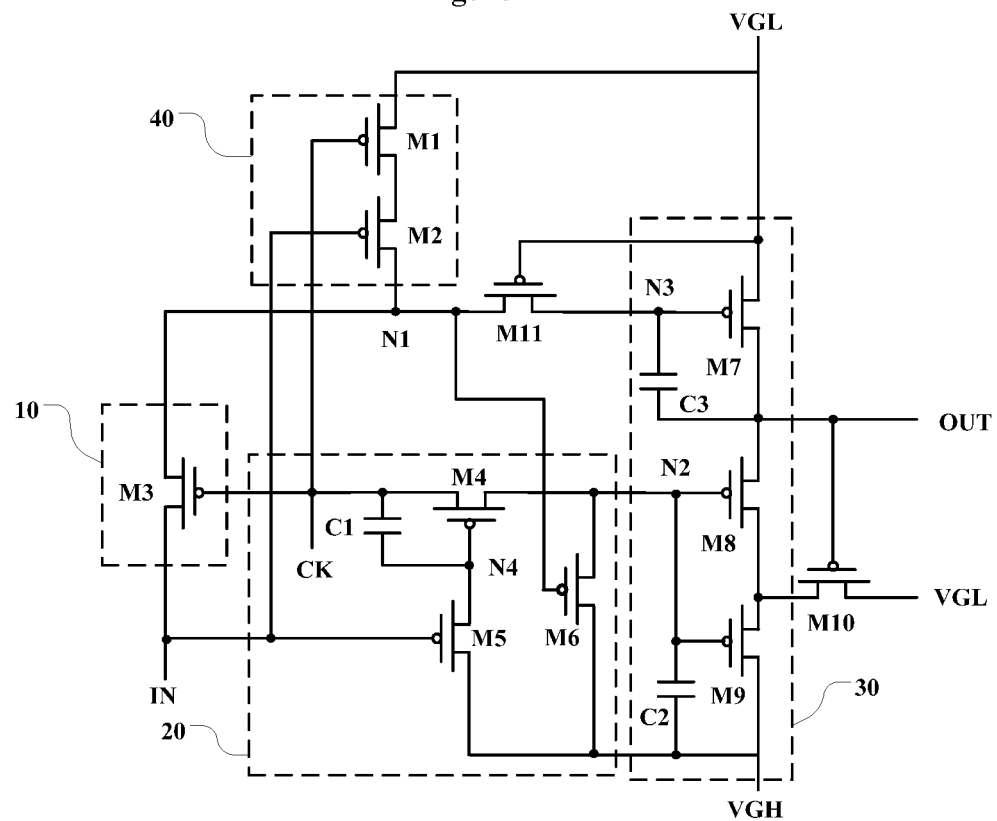
FIG. 11 illustrates a schematic diagram of a shift register of another exemplary display panel consistent with disclosed embodiments of the present disclosure.
Figure 12:
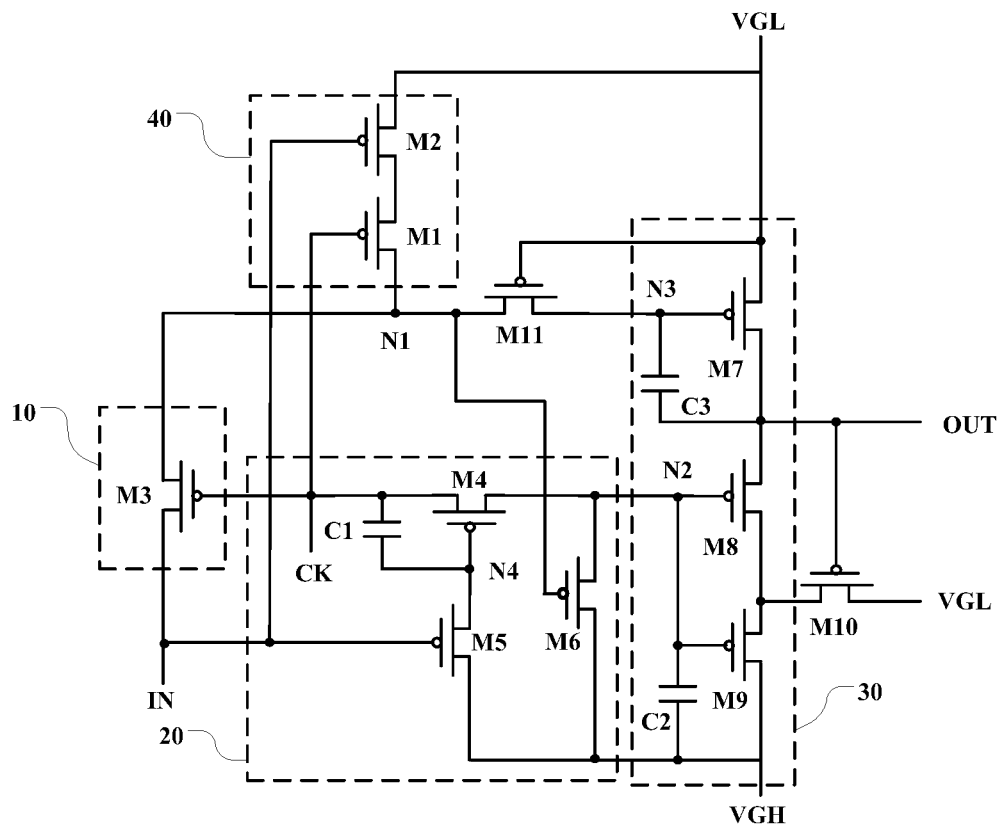
FIG. 12 illustrates a schematic diagram of a shift register of another exemplary display panel consistent with disclosed embodiments of the present disclosure.

FIG. 11 illustrates a schematic diagram of a shift register of another display panel consistent with disclosed embodiments of the present disclosure; and FIG. 12 illustrates a schematic diagram of a shift register of another display panel consistent with disclosed embodiments of the present disclosure. On the basis of the above-disclosed embodiments, in certain embodiments, to further improve the stability of the circuit of the shift register, referring to FIG. 11 and FIG. 12, the shift register may further include a tenth transistor M10 and an eleventh transistor M11. A source of the tenth transistor M10 may be connected to the second voltage signal VGL, a drain of the tenth transistor M10 may be connected to the source of the eighth transistor M8, and a gate of the tenth transistor M10 may be connected to the output signal OUT. A source of the eleventh transistor M11 may be connected to the first node N1, a drain of the eleventh transistor M11 may be connected to the third node N3, and a gate of the eleventh transistor M11 may be connected to the second voltage signal VGL.

Figure 13:
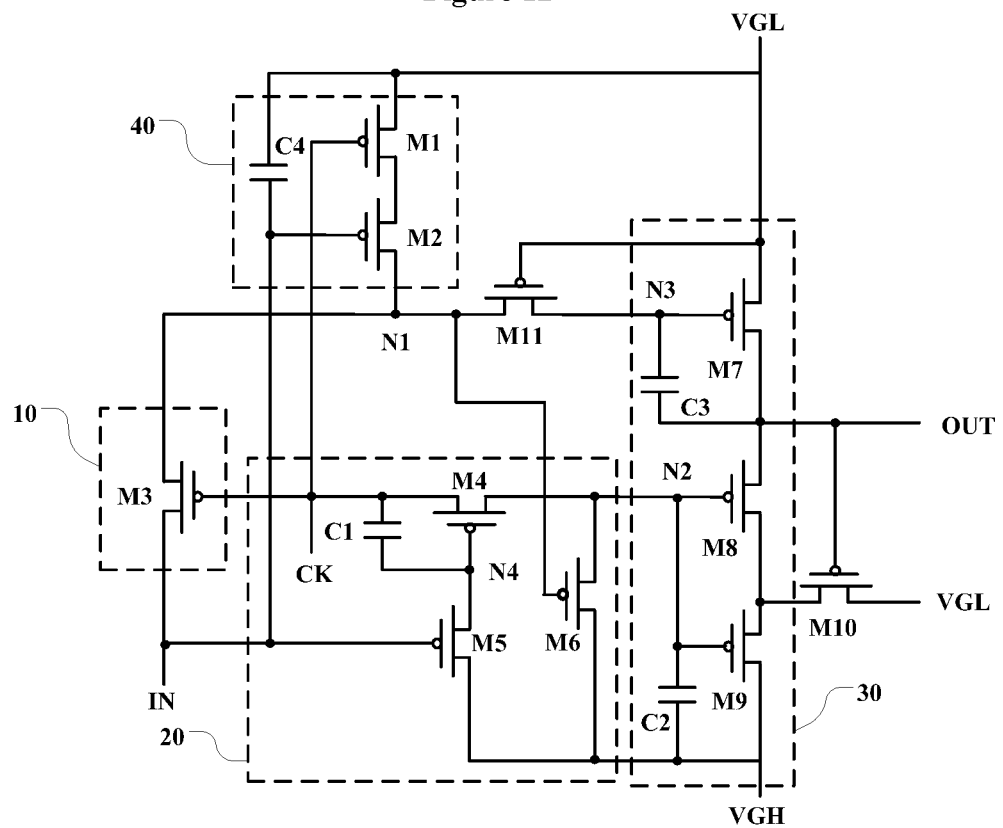
FIG. 13 illustrates a schematic diagram of a shift register of another exemplary display panel consistent with disclosed embodiments of the present disclosure.
Figure 14:
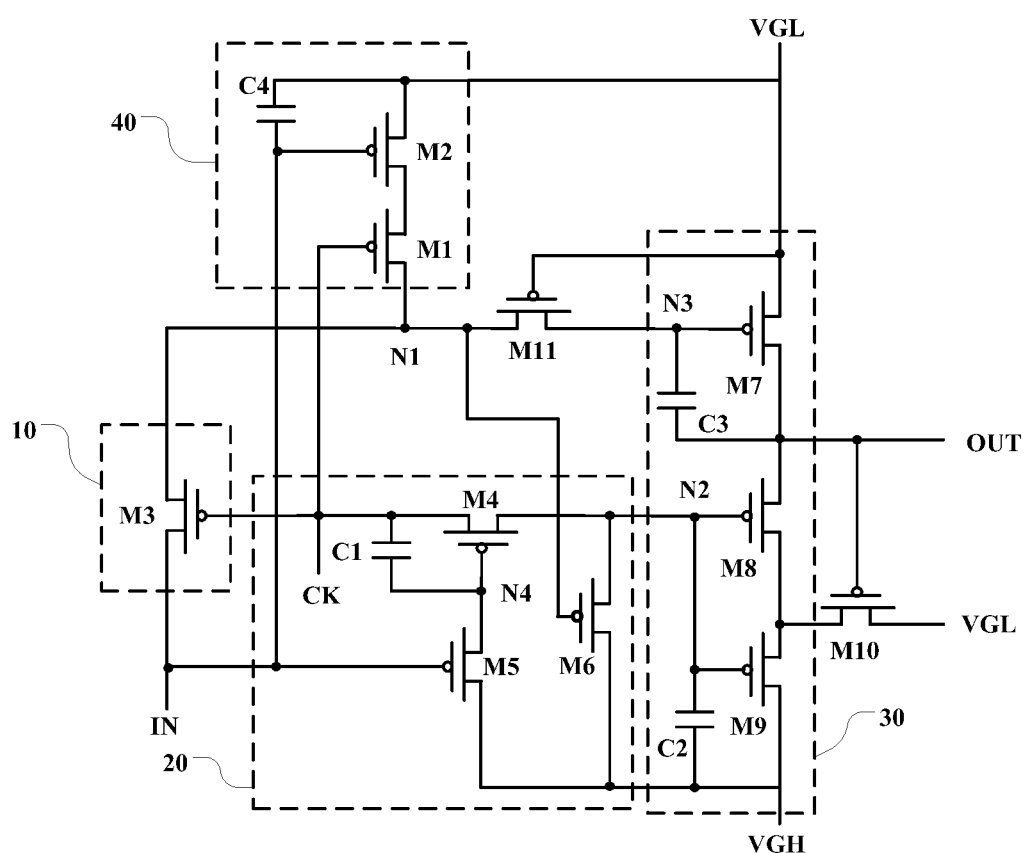
FIG. 14 illustrates a schematic diagram of a shift register of another exemplary display panel consistent with disclosed embodiments of the present disclosure.

FIG. 13 illustrates a schematic diagram of a shift register of another display panel consistent with disclosed embodiments of the present disclosure; and FIG. 14 illustrates a schematic diagram of a shift register of another display panel consistent with disclosed embodiments of the present disclosure. On the basis of any one of the above-disclosed embodiments, in certain embodiments, referring to FIG. 13 and FIG. 14, the fourth control unit 40 may further include a fourth capacitor C4. A first electrode plate of the fourth capacitor C4 may be connected to the second voltage signal VGL, and a second electrode plate of the fourth capacitor C4 may be connected to the input signal IN.

Because the input signal IN is the output signal of the previous-level shift register, the stability of the input signal IN may be substantially poor, which may cause the gate potential of the second transistor M2 to be unstable. Therefore, in certain embodiments, the fourth capacitor C4 may be provided between the gate of the second transistor M2 (connected to the input signal IN) and the second voltage signal VGL, to stabilize the gate potential of the second transistor M2 and to ensure the stable operation of the fourth control unit 40.

Because at the same charges, the larger the capacitance value, the smaller the voltage difference between the two electrode plates of the capacitor (C=Q/U). The fourth capacitor C4 may not only need to stabilize the gate potential of the second transistor M2, but also need to prevent the second voltage signal VGL from affecting the potential of the input signal IN and avoid causing the potential of the input signal IN to change significantly. Therefore, the capacitance value of the fourth capacitor C4 may need to be set to be sufficiently large.

When the seventh transistor M7 is turned on and the output signal OUT is a low level signal, the third capacitor C3 may pull down the potential of the third node N3 through a capacitor between the output terminal OUT and the third node N3, to ensure that the seventh transistor M7 may be operated in a saturated state, and to avoid generating a tailing phenomenon when the output signal OUT changes from a high-level signal to a low-level signal. Therefore, the capacitance value of the third capacitor C3 may be set to be substantially small, to generate a sufficient potential difference between the output terminal OUT and the third node N3.

Based on this, in certain embodiments, the capacitance value of the fourth capacitor C4 may be greater than the capacitance value of the third capacitor C3, to ensure that the fourth capacitor C4 may prevent the second voltage signal VGL from affecting the potential of the input signal IN while stabilizing the gate potential of the second transistor M2, and to ensure that the third capacitor C3 may generate a sufficient potential difference between the output terminal OUT and the third node N3.

It should be noted that merely one connection method of the source and drain of a transistor is used as an example for description, which may not be limited by the present disclosure. In certain embodiments, the connection method of the source and drain of any transistor may be interchanged, which may not be repeated herein.

The working process of the shift register may be described below in conjunction with the timing diagram of each signal in the shift register. It should be noted that the following working process may be merely described by taking the structure of the shift register shown in FIG. 11 as an example, and the timing of signals in the shift register with any other structure may be basically the same, which may not be repeated herein.

Figure 15:
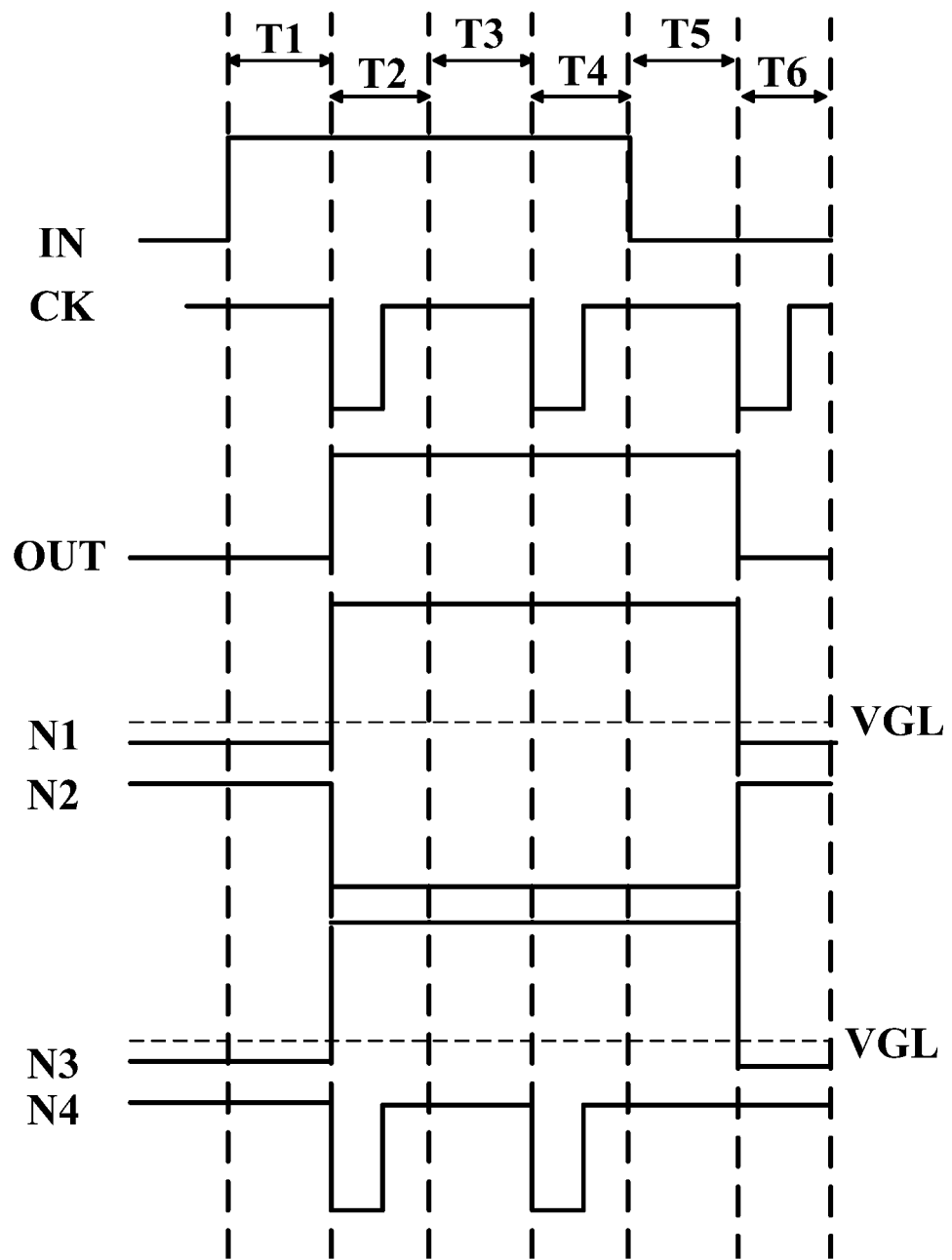
FIG. 15 illustrates a timing diagram of various signals in a shift register of an exemplary display panel consistent with disclosed embodiments of the present disclosure.

FIG. 15 illustrates a timing diagram of various signals in a shift register of a display panel consistent with disclosed embodiments of the present disclosure. Referring to FIG. 15, in a stage T1: the input signal IN may be at a high level, the first clock signal CK may be at a high level, the first transistor M1, the second transistor M2, the third transistor M3, and the fifth transistor M5 may be turned off, the fourth node N4 may be maintained at a high level, the fourth transistor M4 may be turned off, the first node N1 may be maintained at a low level, the eleventh transistor M11 may always be maintained in a turned-on state, the potential of the third node N3 may be the same as the potential of the first node N1, i.e., the third node N3 may be maintained at a low level, the seventh transistor M7 may be turned on, the low level of the second voltage signal VGL may be transmitted to the output terminal OUT, the second node N2 may be maintained at a high level, the eighth transistor M8 and the ninth transistor M9 may be turned off, and the output signal OUT may be maintained at a low level.

In a stage T2: the input signal IN may be at a high level, the first clock signal CK may be at a low level, the third transistor M3 may be turned on, the high level of the input signal IN may be transmitted to the first node N1 to enable the potential of the first node N1 to be at a high level, the third node N3 may be at a high level, and the seventh transistor M7 may be turned off. Under the action of the first capacitor C1, the first clock signal CK may pull down the potential of the fourth node N4 to a low level, the fourth transistor M4 may be turned on, the first clock signal CK may pull down the potential of the second node N2 to a low level, the eighth transistor M8 and the ninth transistor M9 may be turned on, and the high level of the first voltage signal VGH may be transmitted to the output terminal OUT, to enable the output signal OUT to be at a high level.

In a stage T3: the input signal IN may be at a high level, the first clock signal CK may be at a high level, the first node N1 may be maintained at a high level, and the third node N3 may be maintained at a high level. Under the action of the first capacitor C1, the first clock signal CK may raise the potential of the fourth node N4 to a high level, the fourth transistor M4 may be turned off, the second node N2 may be maintained at a low level, the eighth transistor M8 and the ninth transistor M9 may be maintained in a turned-on state, and the output signal OUT may be maintained at a high level.

In a stage T4: the input signal IN may be at a high level, the first clock signal CK may be at a low level, the third transistor M3 may be turned on, the high level of the input signal IN may be transmitted to the first node N1 to enable the first node N1 to be maintained at a high level, the third node N3 may be maintained at a high level, the first clock signal CK may pull down the potential of the fourth node N4 to a low level, the fourth transistor M4 may be turned on, the first clock signal CK may pull down the potential of the second node N2 to a low level, the eighth transistor M8 and the ninth transistor M9 may be maintained in a turned-on state, and the output signal OUT may be at a high level.

In a stage T5: the input signal IN may be at a low level, the first clock signal CK may be at a high level, the third transistor M3 may be turned off, the first node N1 may be maintained at a high level, the third node N3 may be maintained at a high level, the first clock signal CK may raise the potential of the fourth node N4 to a high level, the fourth transistor M4 may be turned off, the second node N2 may be maintained at a low level, the eighth transistor M8 and the ninth transistor M9 may be maintained in a turned-on state, and the output signal OUT may be maintained at a high level.

In a stage T6: the input signal IN may be at a low level, the first clock signal CK may be at a low level, the first transistor M1, the second transistor M2, the third transistor M3, and the fifth transistor M5 may be turned on, the potential of the first node N1 may be pulled down to a low level, the third node N3 may be at a low level, the sixth transistor M6 may be turned on, the potential of the second node N2 may be raised to a high level to turn off the eighth transistor M8 and the ninth transistor M9, the potential of the fourth node N4 may be raised to a high level, the seventh transistor M7 may be turned on, and the output signal OUT may be pulled down to a low level.

Figure 16:
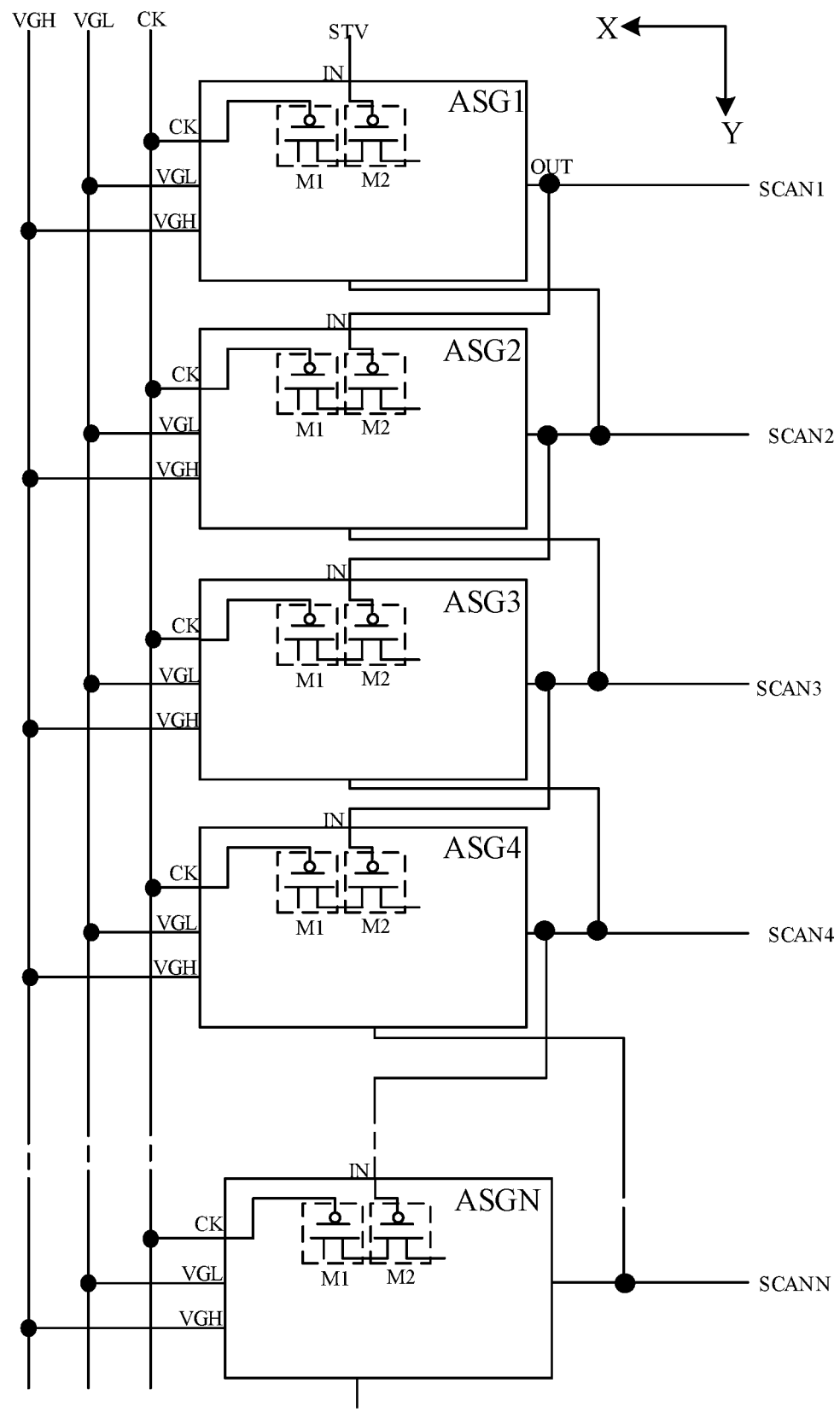
FIG. 16 illustrates a schematic diagram of a layout arrangement of shift registers of an exemplary display panel consistent with disclosed embodiments of the present disclosure.

FIG. 16 illustrates a schematic diagram of a layout arrangement of shift registers of a display panel consistent with disclosed embodiments of the present disclosure. On the basis of any of the above-disclosed embodiments, in certain embodiments, referring to FIG. 16, the shift registers may be cascaded along a first direction. In other words, the N shift registers ASG1-ASGN may be arranged in sequence along the first direction Y. The first transistor M1 and the second transistor M2 in each shift register may be arranged along a second direction X, where the first direction Y may be perpendicular to the second direction X.

The gate of the first transistor M1 may be connected to a signal line for inputting the first clock signal CK, and the gate of the second transistor M2 may be connected to a signal line for inputting the input signal IN, where the input signal IN may be an output signal OUT of a previous-level shift register. In the panel layout, the signal line for inputting the first clock signal CK may often be located outside, e.g., left side, of the shift register, and the signal line for inputting the input signal IN may often be located inside, e.g., right side of the shift register. Therefore, taking into account the layout space of the shift register and the length of the connection line, the first transistor M1 and the second transistor M2 may be arranged along the second direction X.

On the basis of any of the foregoing embodiments, in certain embodiments, the width to length ratio of the channel region of the first transistor M1 may be less than or equal to the width to length ratio of the channel region of the second transistor M2.

The gate of the first transistor M1 may be connected to the first clock signal CK, and the first clock signal CK may be provided by the driving chip, which may have desired stability. The input signal IN may be the output signal OUT of the previous-level shift register, which may have a stability poorer than the first clock signal CK. Therefore, for the second transistor M2 controlled by the input signal IN, output effect of the second transistor M2 may need to be ensured as much as possible. The larger the width to length ratio of the transistor, the better the output signal. Therefore, the width to length ratio of the channel region of the second transistor M2 may increase appropriately. In other words, the width to length ratio of the channel region of the second transistor M2 may be set to be larger than the width to length ratio of the channel region of the first transistor M1, to avoid the problem of unstable potential of the first node N1 caused by the insufficient stability of the input signal IN.

On the basis of any of the foregoing embodiments, in certain embodiments, a threshold voltage of the first transistor M1 may be greater than or equal to a threshold voltage of the second transistor M2.

When the first transistor M1 and the second transistor M2 are turned on, the potential transmitted to the first node N1 may be at a low level, and the gate potentials of the first transistor M1 and the second transistor M2 may also be at a low level. When the threshold voltage of the transistor is substantially large, the operation state region of the transistor may not be saturated. Therefore, the threshold voltages of the first transistor M1 and the second transistor M2 may need to be substantially small, to ensure that the expected signal may be outputted. Furthermore, because the stability of the first clock signal CK connected to the gate of the first transistor M1 is better than the stability of the input signal IN connected to the gate of the second transistor M2, the threshold voltage of the second transistor M2 may need to be equal to or less than the threshold voltage of the first transistor M1, to prevent the problem of instability in the potential outputted to the first node N1 caused by the unstable input signal IN.

On the basis of any of the foregoing embodiments, in certain embodiments, the first transistor M1 may include a double-gate transistor, and/or the second transistor M2 may include a double-gate transistor.

Because the double-gate transistor has two gates, when the transistor is turned off, the transistor may have a substantially small leakage current. Therefore, the first transistor M1 and/or the second transistor M2 may be a double-gate transistor, when one of the first transistor M1 and the second transistors M2 is turned off, and the first node N1 is at a high level, it may be fully ensured that the first node N1 may not be affected by the second voltage signal VGL.

Figure 17:
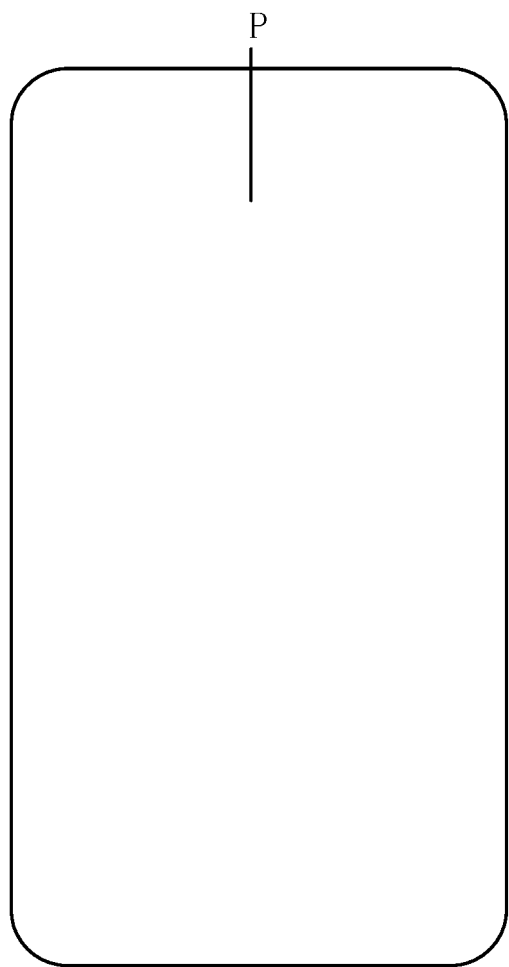
FIG. 17 illustrates a schematic diagram of an exemplary display device consistent with disclosed embodiments of the present disclosure.

The present disclosure also provides a display device. The display device may include a display panel in any of the above-disclosed embodiments. FIG. 17 illustrates a schematic diagram of a display device consistent with disclosed embodiments of the present disclosure. Referring to FIG. 17, the display device P may include, but may not be limited to, a full-screen mobile phone, a tablet computer, and a digital camera, etc. Moreover, the display device P may include a liquid crystal display device, a LED display device, an OLED display device, and a flexible display device, etc.

The present disclosure may have following beneficial effects. In the disclosed display panel and the display device, not only the first control unit may receive the input signal and may control the signal of the first node in response to the first clock signal, but also the fourth control unit may receive the second voltage signal and may control the signal of the first node in response to the input signal and the first clock signal, thereby ensuring the stability of the signal of the first node. Because the third node is connected to the first node, the first control unit and the fourth control unit may ensure the stability of the signal of the third node. In addition, the second control unit may receive the first voltage signal and may control the signal of the second node in response to the input signal and the first clock signal, thereby ensuring the stability of the signal of the second node.

The third control unit may receive the first voltage signal and may generate the output signal in response to the signal of the second node. Alternatively, the third control unit may receive the second voltage signal and may generate the output signal in response to the signal of the third node. Therefore, on the basis of ensuring the stability of the signals of the second node and the third node, the stability of the output signal may be ensured, which may in turn ensure the stability of the output signal of the following-level cascaded shift register and the display effect of the display panel.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
   a driving circuit, wherein:
   the driving circuit includes N-level shift registers cascaded with each other, wherein N is greater than or equal to two, and
   a shift register of the N-level shift registers includes:
   a first control unit, configured to receive an input signal, and control a signal of a first node in response to a first clock signal,
   a second control unit, configured to receive a first voltage signal, and control a signal of a second node in response to the input signal and the first clock signal,
   a third control unit, configured to receive the first voltage signal and generate an output signal in response to the signal of the second node, or receive a second voltage signal and generate an output signal in response to a signal of a third node, wherein the third node is connected to the first node, the first voltage signal is a high-level signal, and the second voltage signal is a low-level signal, and
   a fourth control unit, configured to receive the second voltage signal, and control the signal of the first node in response to the input signal and the first clock signal.

2. The display panel according to claim 1, wherein:
   the fourth control unit includes a first transistor and a second transistor, wherein the first transistor and the second transistor control a potential of the first node in response to the first clock signal by the first transistor and the input signal by the second transistor.

3. The display panel according to claim 2, wherein:
   the first transistor and the second transistor are connected in series, when both the first clock signal and the input signal are low-level signals, the first transistor and the second transistor are turned on, and the second voltage signal is transmitted to the first node.

4. The display panel according to claim 2, wherein:
   a source of the first transistor is connected to the second voltage signal, a drain of the first transistor is connected to a source of the second transistor, and a gate of the first transistor is connected to the first clock signal; and
   the source of the second transistor is connected to the drain of the first transistor, a drain of the second transistor is connected to the first node, and a gate of the second transistor is connected to the input signal.

5. The display panel according to claim 2, wherein:
   a source of the first transistor is connected to a drain of the second transistor, a drain of the first transistor is connected to the first node, and a gate of the first transistor is connected to the first clock signal; and
   a source of the second transistor is connected the second voltage signal, the drain of the second transistor is connected to the source of the first transistor, and a gate of the second transistor is connected to the input signal.

6. The display panel according to claim 2, wherein:
   the N-level shift registers are cascaded along a first direction, and the first transistor and the second transistor in each shift register of the N-level shift registers are arranged along a second direction, wherein the first direction is perpendicular to the second direction.

7. The display panel according to claim 2, wherein:
   a width to length ratio of a channel region of the first transistor is less than or equal to a width to length ratio of a channel region of the second transistor.

8. The display panel according to claim 2, wherein:
   a threshold voltage of the first transistor is greater than or equal to a threshold voltage of the second transistor.

9. The display panel according to claim 2, wherein:
   the first transistor includes a double-gate transistor, and/or the second transistor includes a double-gate transistor.

10. The display panel according to claim 2, wherein:
    the first control unit includes a third transistor, wherein a source of the third transistor is connected to the input signal, a drain of the third transistor is connected to the first node, and a gate of the third transistor is connected to the first clock signal;
    the second control unit includes a fourth transistor, a fifth transistor, a sixth transistor, and a first capacitor, wherein:
    a source of the fourth transistor is connected to the first clock signal, a drain of the fourth transistor is connected to the second node, and a gate of the fourth transistor is connected to a fourth node,
    a source of the fifth transistor is connected to the first voltage signal, a drain of the fifth transistor is connected to the fourth node, and a gate of the fifth transistor is connected to the input signal,
    a source of the sixth transistor is connected to the first voltage signal, a drain of the sixth transistor is connected to the second node, and a gate of the sixth transistor is connected to the first node, and
    a first electrode plate of the first capacitor is connected to the first clock signal, and a second electrode plate of the first capacitor is connected to the fourth node; and
    the third control unit includes a seventh transistor and an eighth transistor, wherein:
    a source of the seventh transistor is connected to the second voltage signal, a drain of the seventh transistor is connected to the output signal, and a gate of the seventh transistor is connected to the third node, and
    a source of the eighth transistor is connected to the first voltage signal, a drain of the eighth transistor is connected to the output signal, and a gate of the eighth transistor is connected to the second node.

11. The display panel according to claim 10, wherein:
    the third control unit further includes a ninth transistor, a second capacitor, and a third capacitor, wherein:
    a source of the ninth transistor is connected to the first voltage signal, a drain of the ninth transistor is connected to the source of the eighth transistor, and a gate of the ninth transistor is connected to the second node,
    a first electrode plate of the second capacitor is connected to the first voltage signal, and a second electrode plate of the second capacitor is connected to the second node, and a first electrode plate of the third capacitor is connected to the third node, and a second electrode plate of the third capacitor is connected to the output signal.

12. The display panel according to claim 11, wherein:
the shift register further includes a tenth transistor and an eleventh transistor, wherein:
- a source of the tenth transistor is connected to the second voltage signal, a drain of the tenth transistor is connected to the source of the eighth transistor, and a gate of the tenth transistor is connected to the output signal, and
- a source of the eleventh transistor is connected to the first node, a drain of the eleventh transistor is connected to the third node, and a gate of the eleventh transistor is connected to the second voltage signal.

13. The display panel according to claim 10, wherein:
a width to length ratio of a channel region of the first transistor is less than a width to length ratio of a channel region of the seventh transistor, or
the width to length ratio of the channel region of the first transistor is less than a width to length ratio of a channel region of the eighth transistor, or
a width to length ratio of a channel region of the second transistor is less than the width to length ratio of the channel region of the seventh transistor, or
the width to length ratio of the channel region of the second transistor is less than the width to length ratio of the channel region of the eighth transistor.

14. The display panel according to claim 11, wherein:
the fourth control unit further includes a fourth capacitor, wherein a first electrode plate of the fourth capacitor is connected to the second voltage signal, and a second electrode plate of the fourth capacitor is connected to the input signal.

15. The display panel according to claim 14, wherein:
a capacitance value of the fourth capacitor is greater than a capacitance value of the third capacitor.

16. The display panel according to claim 1, wherein:
the shift register includes a first shift register and a second shift register, and the first clock signal includes a first sub-clock signal and a second sub-clock signal;
the first shift register controls potentials of the first node and the second node in response to the first sub-clock signal; and
the second shift register controls potentials of the first node and the second node in response to the second sub-clock signal, wherein:
- a time length of effective pulses of the first sub-clock signal and the second sub-clock signal is T1, and
- a timing of the effective pulse of the first sub-clock signal lags a timing of the effective pulse of the second sub-clock signal by a time length of T2, wherein T2>T1.

17. The display panel according to claim 16, wherein:
the first shift register controls an output signal of an odd-level shift register, and
the second shift register controls an output signal of an even-level shift register.

18. A display device, comprising:
a display panel, wherein the display panel includes:
a driving circuit, wherein:
the driving circuit includes N-level shift registers cascaded with each other, wherein N is greater than or equal to two, and
a shift register of the N-level shift registers includes:
- a first control unit, configured to receive an input signal, and control a signal of a first node in response to a first clock signal,
- a second control unit, configured to receive a first voltage signal, and control a signal of a second node in response to the input signal and the first clock signal,
- a third control unit, configured to receive the first voltage signal and generate an output signal in response to the signal of the second node, or receive a second voltage signal and generate an output signal in response to a signal of a third node, wherein the third node is connected to the first node, the first voltage signal is a high-level signal, and the second voltage signal is a low-level signal, and
- a fourth control unit, configured to receive the second voltage signal, and control the signal of the first node in response to the input signal and the first clock signal.

* * * * *